(12) United States Patent
Kitamura

(10) Patent No.: US 8,063,546 B2
(45) Date of Patent: Nov. 22, 2011

(54) VIBRATOR COMPRISING TWO X-CUT CRYSTAL SUBSTRATES WITH AN INTERMEDIATE ELECTRODE

(75) Inventor: Fumitaka Kitamura, Suwa (JP)

(73) Assignee: Seiko Epson Corporation (JP)

( * ) Notice: Subject to any disclaimer, the term of this patent is extended or adjusted under 35 U.S.C. 154(b) by 349 days.

(21) Appl. No.: 12/371,987

(22) Filed: Feb. 17, 2009

(65) Prior Publication Data

US 2009/0206704 A1 Aug. 20, 2009

(30) Foreign Application Priority Data

Feb. 20, 2008 (JP) .................................. 2008-038838

(51) Int. Cl.
*H03H 9/19* (2006.01)
(52) U.S. Cl. ........................................................ 310/370
(58) Field of Classification Search .................... 310/370
See application file for complete search history.

(56) References Cited

U.S. PATENT DOCUMENTS

| | | | | |
|---|---|---|---|---|
| 3,969,641 A | * | 7/1976 | Oguchi et al. ................. | 310/348 |
| 4,099,078 A | * | 7/1978 | Shibata et al. ................ | 310/361 |
| 4,232,109 A | * | 11/1980 | Kizaki .......................... | 430/312 |
| 4,253,036 A | * | 2/1981 | Kizaki .......................... | 310/361 |
| 5,854,427 A | * | 12/1998 | Terada et al. ................ | 73/504.16 |
| 6,437,483 B2 | * | 8/2002 | Kikuchi et al. ................ | 310/321 |
| 6,523,410 B2 | * | 2/2003 | Matsubara et al. ........ | 73/504.16 |
| 6,532,817 B1 | * | 3/2003 | Yukawa et al. ............. | 73/504.16 |
| 6,564,639 B1 | * | 5/2003 | Hatanaka et al. .......... | 73/504.16 |
| 6,666,091 B2 | * | 12/2003 | Hatanaka et al. .......... | 73/504.16 |
| 6,930,440 B2 | * | 8/2005 | Chiba et al. ................... | 310/370 |
| 7,061,167 B2 | | 6/2006 | Yamada | |
| 7,205,708 B2 | | 4/2007 | Yamada | |

FOREIGN PATENT DOCUMENTS

| | | |
|---|---|---|
| EP | 955519 A2 * | 11/1999 |
| JP | 58-064128 | 4/1983 |
| JP | 08094362 A * | 4/1996 |
| JP | 08128833 A * | 5/1996 |
| JP | 09-014967 | 1/1997 |
| JP | 09005085 A * | 1/1997 |
| JP | 11-316125 | 11/1999 |
| JP | 11316125 A * | 11/1999 |
| JP | 2001165664 A * | 6/2001 |
| JP | 2004-062134 | 2/2004 |
| JP | 2004-343541 | 12/2004 |
| JP | 2006-238001 | 9/2006 |

* cited by examiner

*Primary Examiner* — J. San Martin
(74) *Attorney, Agent, or Firm* — Harness, Dickey & Pierce, P.L.C.

(57) ABSTRACT

A vibratory structure includes: a first X-cut crystal substrate; a second X-cut crystal substrate stacked on the first X-cut crystal substrate so that the x-axis of the second X-cut crystal substrate is parallel to the x-axis of the first X-cut crystal substrate; a base formed by the first X-cut crystal substrate and the second X-cut crystal substrate; and vibratory arm sections formed so as to be integrated together with the base in one body, and protruding from the base.

11 Claims, 12 Drawing Sheets

FIG. 2
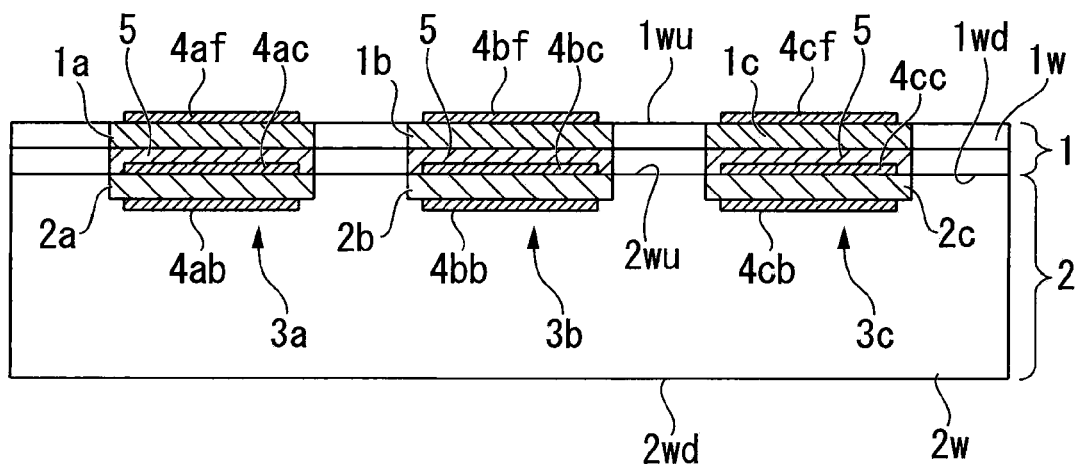
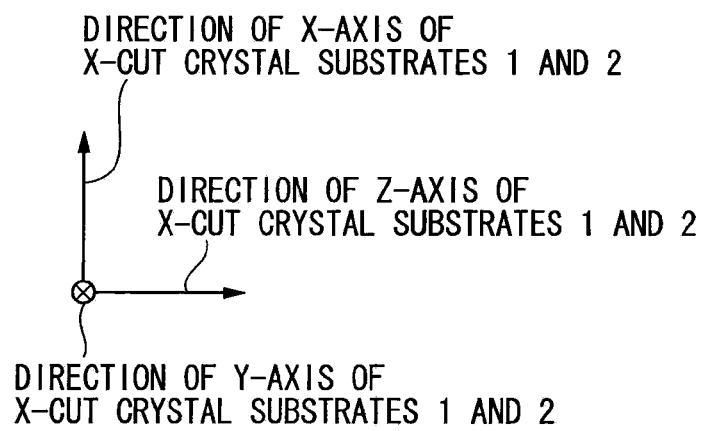

RELATIONSHIP BETWEEN LENGTH AND THICKNESS IN TUNING-FORK

FIG. 8
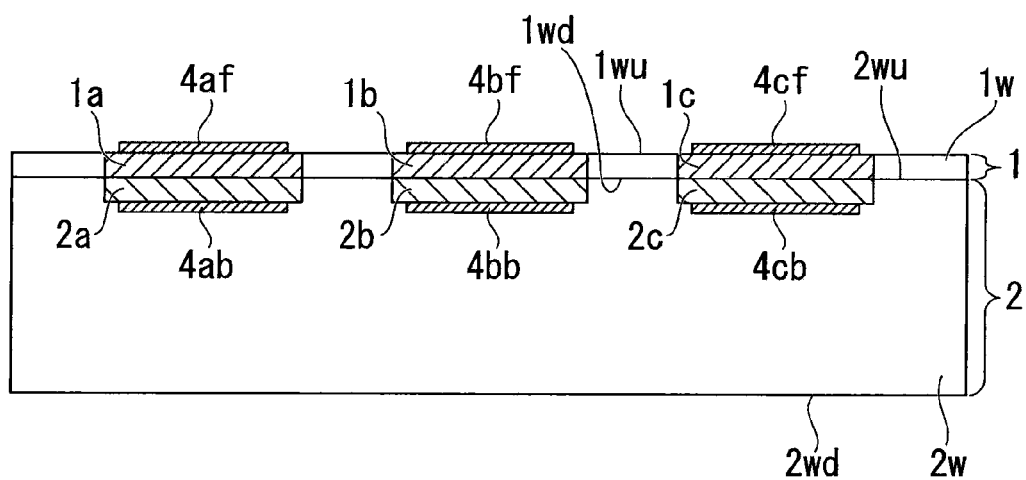
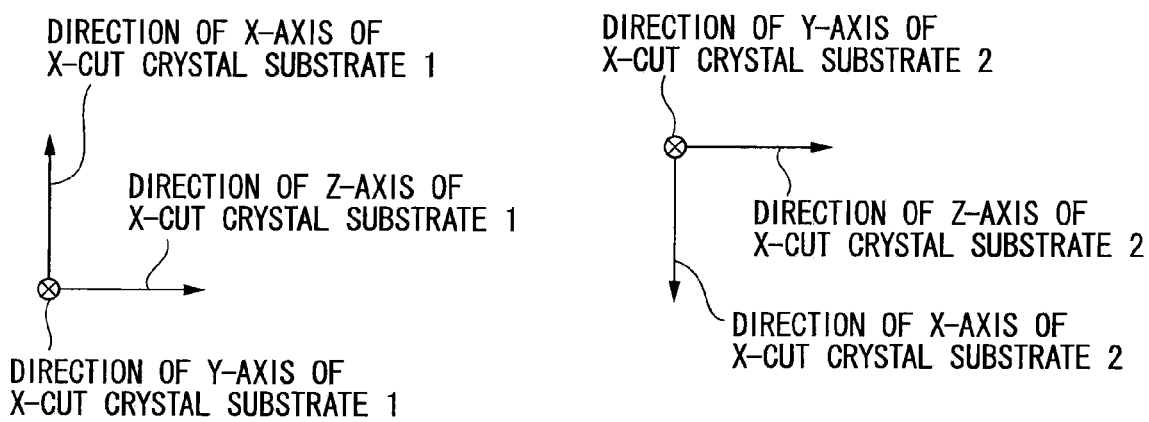

VIBRATOR COMPRISING TWO X-CUT CRYSTAL SUBSTRATES WITH AN INTERMEDIATE ELECTRODE

CROSS-REFERENCE TO RELATED APPLICATION

This application is based on and claims priority from Japanese Patent Application No. 2008-038838, filed on Feb. 20, 2008, the contents of which are incorporated herein by reference.

BACKGROUND

1. Technical Field

The present invention relates to a vibratory structure made of, for example, a crystal or the like, a vibrator including this vibratory structure, an oscillator provided with this vibrator, and an electronic apparatus.

2. Related Art

Conventionally, a quartz crystal vibrator functioning as a frequency control element is adopted for an oscillation circuit provided in various electronic apparatuses.

Specifically, a tuning-fork type quartz crystal vibrator is used as a quartz crystal vibrator that is downsized, break-proof, and that accurately vibrates at a low electric power.

In the above-described tuning-fork type quartz crystal vibrator, the number of vibrations, that is the frequency, is mainly determined by the length and the width of an arm of a quartz crystal vibratory element.

Specifically, the above-described tuning-fork type vibrator for functioning as a clock source is incorporated together with an oscillation circuit into various electronic apparatuses such as a clock.

In recent years, in conjunction with the downsizing of various electronic apparatuses, a tuning-fork type vibrator of a small size has become required.

As a foregoing downsized tuning-fork type vibrator, the tuning-fork type quartz crystal vibrator including the structure which has a couple of vibratory arm sections and in which grooves are formed on the main face of each of the vibratory arm sections and drive efficiency of the quartz crystal vibratory element is improved is known.

FIG. 15 is a plan view illustrating a conventional example of a tuning-fork type vibrator.

This tuning-fork type vibrator is constituted by a crystal substrate of a Z-plate (Z-cut) in which a main face is orthogonal to the z-axis of crystal axes (xyz).

A couple of vibratory arm sections 12 and 13 are formed so as to extend from a base 11.

Here, with regard to crystal axes (xyz) in the tuning-fork type vibrator, the x-axis direction corresponds to the width (W), the y-axis direction corresponds to the length (L), and the z-axis direction corresponds to the thickness (D).

FIG. 16 is a cross-sectional view illustrating the conventional example of the tuning-fork type vibrator taken along the line C-C shown in FIG. 15.

As shown in FIG. 16, in each of the vibratory arm sections 12 and 13, grooves 12a and 13a are formed on the main faces (face perpendicular to the z-axis direction), and grooves 12b and 13b are formed on the back faces.

In addition, as shown in FIG. 16, drive electrodes are formed on the groove and a side face of each of the vibratory arm sections 12b and 13b so as to drive the vibratory arm sections 12b and 13b.

In each of the vibratory arm sections 12b and 13b, the drive electrode 14a is formed in the groove 12a and the drive electrode 14b is formed in the groove 12b. The drive electrodes 14c and 14d are formed on both side faces of the vibratory arm section 12.

The drive electrode 15a is formed in the groove 13a and the drive electrode 15b is formed in the groove 13b. The drive electrodes 15c and 15d are formed on both sides of the vibratory arm section 13.

Here, the side faces of the vibratory arm section 12 and the sides of the vibratory arm section 13 are the faces that are orthogonal to the x-axis direction.

In addition, in each of the vibratory arm sections 12b and 13b, the vibratory arm sections 12b and 13b are wire-connected to each other so that a drive-voltage with a coordinate phase is supplied to the drive electrodes 14a, 14b, 15c, and 15d, and a drive-voltage with an opposite phase related to the foregoing electrodes is supplied to the drive electrodes 14c, 14d, 15a, and 15b.

As a result, in each of the vibratory arm sections 12b and 13b, inflection vibration is generated by the electrical field generated between the main faces and the side faces in forward/backward directions, and the tuning fork is thereby vibrated.

For example, in the vibratory arm section 12, by supplying the electrical field in the x-axis direction from an inner periphery face of the groove to both side faces, when the left side portion shown in FIG. 16 is extended in the y-axis direction, the right side portion is contracted, and the vibratory arm section 12 is thereby displaced toward the vibratory arm section 13 in a direction in which the vibratory arm sections 12 and 13 face each other.

In contrast, in the vibratory arm section 13, by supplying the electrical field in the x-axis direction from both side faces to the inner periphery face of the groove, when the left side portion shown in FIG. 16 is contracted in the y-axis direction, the right side portion is extended, and the vibratory arm section 13 is thereby displaced toward the vibratory arm section 12 in a direction in which the vibratory arm sections 12 and 13 face each other.

In addition, by supplying voltage to each electrode so as to generate the electrical field in an opposite direction relative to the above-described case, the vibratory arm sections 12b and 13b vibrate in a direction in which the vibratory arm sections 12b and 13b are drawn apart from each other. Therefore, the vibratory arm sections 12b and 13b are vibrated in a retrorse horizontal direction, and the tuning fork is thereby vibrated.

As shown in FIG. 17A, normal vibration in the horizontal direction (x-axis direction) indicated by arrow B of the drawing is generated when the width W is comparatively great and the thickness D is comparatively low in the vibratory arm sections 12b and 13b.

However, if the width W is less than or equal to 1.2 times the thickness D, a vertical component that is vibration component in the direction indicated by arrow C is added in, the vibration in the direction indicated by arrow E as shown in FIG. 17B is thereby generated.

When the vibration component in the direction indicated by arrow C communicates to the base, energy (vibration energy) is lost in an adhesive or the like disposed on the fixed region of base 11 at which the vibratory element shown in FIG. 15 is fixed to a package or the like.

Therefore, the vibration by vibratory arm sections 12b and 13b may lack stability caused by variations in the fixation strength of the vibratory element.

Consequently, there is a problem in that variations in the CI (crystal impedance) values of mass-produced vibratory elements increase.

Therefore, as shown in FIG. 15, in the base 11 including a side face 11r from which the vibratory arm sections 12b and 13b are extended, and side faces 11q that makes an angle together with the side face 11r and comes in contact with the angle, the structure in which an incision 16 is formed on the side faces 11q is proposed.

In the tuning-fork type vibrator including the structure having the incision 16, it is possible to prevent the vibration of the vibratory arm section from leaking out toward the base 11.

This tuning-fork type vibrator is disclosed in, for example, Japanese Unexamined Patent Application, First Publication No. 2004-62134.

As a result, by the above-described structure, it is possible to downsize the base 11 while the CI value is maintained, downsize whole vibratory element, and reduce variations in the CI values of mass-produced vibratory elements.

In the vibratory element disclosed in Japanese Unexamined Patent Application, First Publication No. 2004-62134, the frequency is determined by the ratio between the width of the vibratory arm section and the length of the vibratory arm section (f∝W/L2).

However, in the case of attempting to further downsize the vibratory element, the width of the vibratory arm section is extremely small, and it is thereby difficult to form a groove with a stabilized shape.

Therefore, the intensity of electrical field supplied to a crystal section is variable, oscillation characteristics become unstable, and one of or all of characteristic values such as a CI value, a Q value, the capacitor ratio, or the like become degraded.

SUMMARY

An advantage of some aspects of the invention is to provide a vibratory structure, a vibrator, and an oscillator, that can be downsized while uniformizing an electrical field that are supplied to a crystalline portion between the vibrators (i.e., while maintaining the characteristics such as CI value, Q value, and capacitor ratio).

A first aspect of the invention provides a vibratory structure, including: a first X-cut crystal substrate; a second X-cut crystal substrate stacked on the first X-cut crystal substrate so that the x-axis of the second X-cut crystal substrate is parallel to the x-axis of the first X-cut crystal substrate; a base formed by the first X-cut crystal substrate and the second X-cut crystal substrate; vibratory arm sections formed so as to be integrated together with the base in one body, and protruding from the base.

It is preferable that, in the vibratory structure of the first aspect of the invention, the base and the vibratory arm sections be formed so that the second X-cut crystal substrate is stacked on the first X-cut crystal substrate, the y-axis of the first X-cut crystal substrate is parallel to the y-axis of the second X-cut crystal substrate, and the z-axis of the first X-cut crystal substrate is parallel to the z-axis of the second X-cut crystal substrate.

It is preferable that, in the vibratory structure of the first aspect of the invention, the base and the vibratory arm sections be formed so that the second X-cut crystal substrate is stacked on the first X-cut crystal substrate, the x-axis direction of the first X-cut crystal substrate is identical to the x-axis direction of the second X-cut crystal substrate.

It is preferable that, in the vibratory structure of the first aspect of the invention, the base and the vibratory arm sections be formed so that the second X-cut crystal substrate is stacked on the first X-cut crystal substrate, the x-axis direction of the first X-cut crystal substrate is inverted to the x-axis direction of the second X-cut crystal substrate.

In the vibratory structure of the first aspect of the invention, as described above, the second X-cut crystal substrate is stacked on the first X-cut crystal substrate so that the x-axis of the first X-cut crystal substrate is coincided with the x-axis of the second X-cut crystal substrate, and the vibratory arm sections are thereby formed. In the vibratory arm section, the longitudinal direction thereof corresponds to the y-axis, the lateral direction (width direction) thereof corresponds to the z-axis, and the thickness direction thereof corresponds to the x-axis.

In this structure, the vibratory structure of the invention vibrates in the x-axis direction.

Since vibration frequency is determined by the length and the thickness of a vibratory arm section, a vibratory structure having the thickness with a high level of precision can be manufactured.

In addition, electric fields that are supplied to crystal portions of the vibratory structures can be equal, and it is possible to downsize the vibratory structure while maintaining the characteristics such as a CI value, a Q value, the capacitor ratio, or the like.

It is preferable that the vibratory structure of the first aspect of the invention further include: an intermediate electrode sandwiched between the first X-cut crystal substrate and the second X-cut crystal substrate; a first drive electrode formed on an upper face of the vibratory arm section, the upper face being perpendicular to the x-axis of the vibratory arm section; and a second drive electrode formed on a back face of the vibratory arm section, the back face being perpendicular to the x-axis of the vibratory arm section.

It is preferable that, in the vibratory structure of the first aspect of the invention, the intermediate electrode be formed on each of the first X-cut crystal substrate and the second X-cut crystal substrate.

It is preferable that the vibratory structure of the first aspect of the invention further include insulating film that is adjacent to the intermediate electrode.

It is preferable that, in the vibratory structure of the first aspect of the invention, the phase of voltage supplied to both the first drive electrode and the second drive electrode be inverted to the phase of voltage supplied to the intermediate electrode.

In the vibratory structure of the invention, as above-described structure, the voltage can be independently supplied to each of the first X-cut crystal substrate and the second X-cut crystal substrate.

That is, the electric field that is supplied to a whole quartz crystal substrate in a thickness direction as a conventional example is supplied to each of the first X-cut crystal substrate and the second X-cut crystal substrate.

Therefore, piezoelectric efficiency is improved in the vibratory structure, and it is possible to effectively invert the supplied voltage into vibration thereof, compared with a conventional example.

It is preferable that, in the vibratory structure of the first aspect of the invention, the second X-cut crystal substrate be stacked on the first X-cut crystal substrate so that the x-axis direction of the first X-cut crystal substrate is inverted to the x-axis direction of the second X-cut crystal substrate.

It is preferable that the vibratory structure of the first aspect of the invention further include: a first drive electrode formed on an upper face of the vibratory arm section, the upper face being perpendicular to the x-axis of the vibratory arm section; and a second drive electrode formed on a back face of the vibratory arm section, the back face being perpendicular to the x-axis of the vibratory arm section.

It is preferable that, in the vibratory structure of the first aspect of the invention, the phase of voltage supplied to the first drive electrode be inverted to the phase of voltage supplied to the second drive electrode.

In the vibratory structure of the invention, as the above-described structure, the vibratory arm sections are formed by connecting the first X-cut crystal substrate and the second X-cut crystal substrate using, for example, a direct connection method.

It is possible to easily realize the structure vibrating in an up-and-down direction by supplying the voltages with different phases to each of the first drive electrode formed on the upper face perpendicular to the x-axis and the second drive electrode formed on the back face perpendicular to the x-axis.

It is preferable that the vibratory structure of the first aspect of the invention further include a plurality of the vibratory arm sections. In the two vibratory arm sections that are adjacent to each other, the phase of voltage in one of the vibratory arm sections is inverted to the phase of voltage in the other of the vibratory arm sections.

In the vibratory structure of the first aspect of the invention, as the above-described structure, since the vibratory arm sections adjacent to each other vibrate in the opposite directions along the x-axis, vibration energy transmitting to the base is suppressed caused by countering and canceling each vibration.

Consequently, it is possible to reduce the lack of stability of the vibration of the vibratory arm sections caused by variations in the fixation strength of the vibratory structure.

A second aspect of the invention provides a vibrator including a vibratory structure and a package. The vibratory structure includes a first X-cut crystal substrate; a second X-cut crystal substrate stacked on the first X-cut crystal substrate so that the x-axis of the second X-cut crystal substrate is parallel to the x-axis of the first X-cut crystal substrate; a base formed by the first X-cut crystal substrate and the second X-cut crystal substrate; and vibratory arm sections formed so as to be integrated together with the base in one body, and protruding from the base; and a package containing the vibratory structure. The package contains the above-described vibratory structure.

According to the above-described structure, since the vibrator of the invention uses the above-described vibratory structure, it is possible to downsize the vibrator while maintaining the characteristics such as a CI value, a Q value, the capacitor ratio, or the like.

A third aspect of the invention provides an oscillator including a vibratory structure, an integrated circuit, and a package. The vibratory structure includes a first X-cut crystal substrate; a second X-cut crystal substrate stacked on the first X-cut crystal substrate so that the x-axis of the second X-cut crystal substrate is parallel to the x-axis of the first X-cut crystal substrate; a base formed by the first X-cut crystal substrate and the second X-cut crystal substrate; and vibratory arm sections formed so as to be integrated together with the base in one body, and protruding from the base; and a package containing the vibratory structure. The package contains the above-described vibratory structure and the integrated circuit.

According to the above-described structure, since the oscillator of the invention uses the above-described vibratory structure, it is possible to downsize the oscillator while maintaining the characteristics such as a CI value, a Q value, the capacitor ratio, or the like.

BRIEF DESCRIPTION OF THE DRAWINGS

FIG. 2 is a cross-sectional view showing the vibratory structure of the first embodiment of the invention taken along the line A-A shown in FIG. 1.

FIG. 8 is a cross-sectional view showing the vibratory structure of the second embodiment of the invention taken along the line B-B shown in FIG. 7.

DESCRIPTION OF EXEMPLARY EMBODIMENTS

First Embodiment

Firstly, a quartz crystal vibratory structure of a first embodiment of the invention will be described with reference to drawings.

Figure 1:
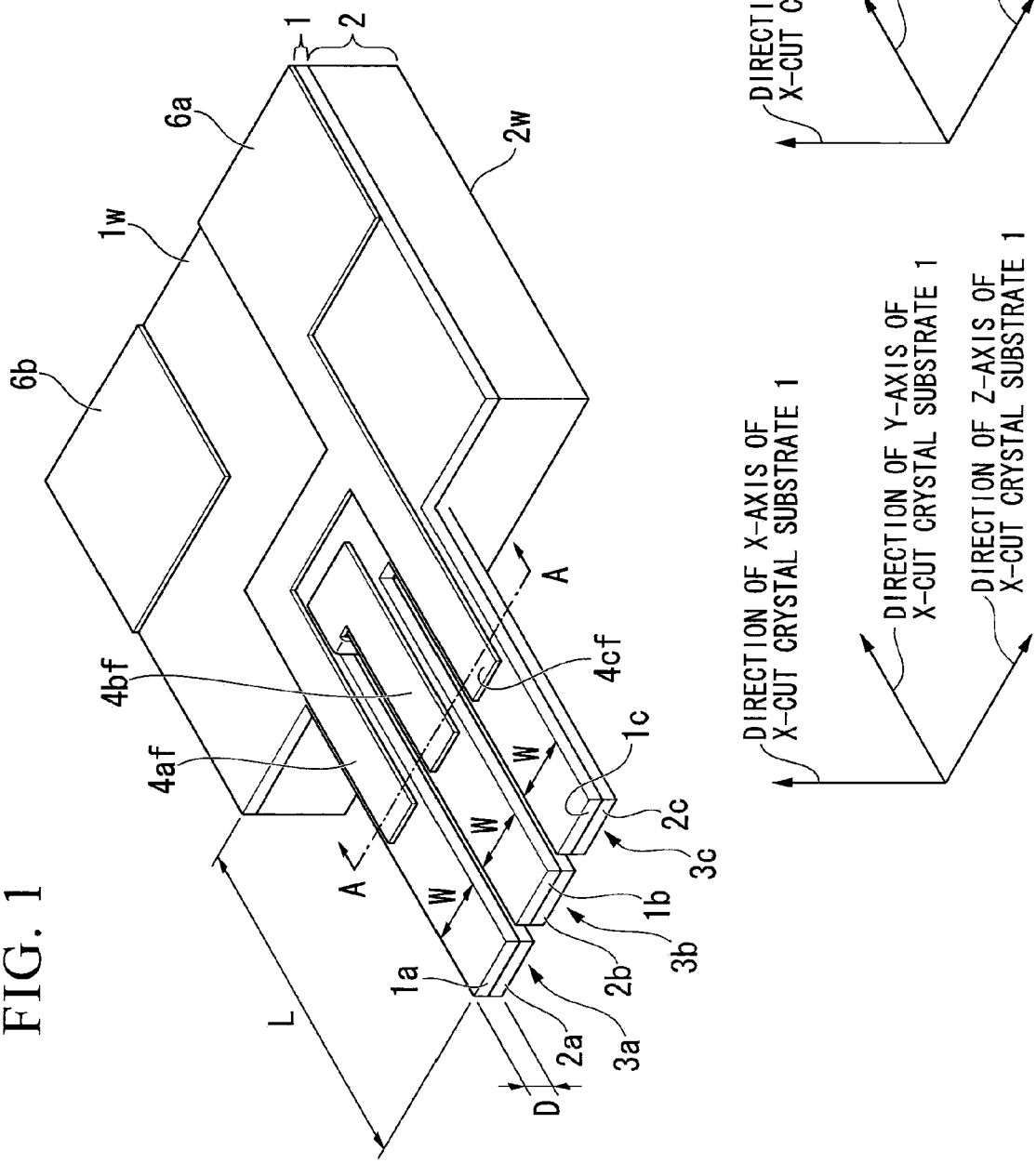
FIG. 1 is a perspective view showing an example structure of a vibratory structure of a first embodiment of the invention.

FIG. 1 is a perspective view showing a tuning-fork type vibratory structure of the first embodiment of the invention.

FIG. 2 is a cross-sectional view showing the tuning-fork type vibratory structure of the first embodiment of the invention taken along the line A-A shown in FIG. 1.

This tuning-fork type vibratory structure is constituted of a X-cut crystal substrate 1 (second X-cut crystal substrate) and a X-cut crystal substrate 2 (first X-cut crystal substrate).

Each of the X-cut crystal substrates 1 and 2 is an X plate (X-cut) whose main face is orthogonal to the x-axis in the crystal axis (xyz).

In the crystal axis (xyz), the X-cut crystal substrates 1 and 2 are stacked and connected to each other so that the x-axis of crystal of the X-cut crystal substrate 1 is parallel to that of the X-cut crystal substrate 2.

In addition, the X-cut crystal substrates 1 and 2 are connected to each other so that the x-axis direction of the X-cut crystal substrate 1 is identical to the x-axis direction of the X-cut crystal substrate 2.

The x-axis of the X-cut crystal substrate 1 may be substantially parallel to the x-axis of the X-cut crystal substrate 2, and the x-axis of the X-cut crystal substrate 1 may be slightly tilted to the x-axis of the X-cut crystal substrate 2.

Here, as the crystal used for the X-cut crystal substrates 1 and 2, an identical crystal system is used, and any of the right-hand system crystal or the left-hand system crystal may be used.

The above-described X-cut crystal substrate 2 is constituted of a base 2w and vibratory arm section reeds 2a, 2b, and 2c.

The vibratory arm section reeds 2a, 2b, and 2c are extended from one end of an upper portion of the base 2w and parallel to a base upper face 2wu.

That is, the base 2w and the vibratory arm section reeds 2a, 2b, and 2c are formed so as to be integrated in one body.

In addition, the above-described X-cut crystal substrate 1 is constituted of a base 1w and vibratory arm section reeds 1a, 1b, and 1c.

The thicknesses of the vibratory arm section reeds 1a, 1b, and 1c are identical to the base 1w.

The vibratory arm section reeds 1a, 1b, and 1c are extended from the side face of the base 2w and parallel to a base back face 1wd.

That is, the base 1w and the vibratory arm section reeds 1a, 1b, and 1c are formed so as to be integrated in one body.

In the vibratory arm section reeds 1a, 1b, 1c, 2a, 2b, and 2c of the tuning-fork type vibrator of this embodiment, the x-axis direction (vibration direction) of the crystal axis (xyz) corresponds to the thickness thereof, the y-axis direction corresponds to the length thereof in the longitudinal direction, and z-axis direction corresponds to the width thereof in the lateral direction.

Not only the x-axis of crystal of the X-cut crystal substrates 1 and 2, but also the X-cut crystal substrates 1 and 2 are stacked and connected so that the y-axis and z-axis of the X-cut crystal substrate 1 are parallel to the y-axis and z-axis of the X-cut crystal substrate 2, respectively.

The y-axis of the X-cut crystal substrate 1 may be substantially parallel to the y-axis of the X-cut crystal substrate 2, and the y-axis of the X-cut crystal substrate 1 may be slightly tilted to the y-axis of the X-cut crystal substrate 2.

In addition, the z-axis of the X-cut crystal substrate 1 may be substantially parallel to the z-axis of the X-cut crystal substrate 2, and the z-axis of the X-cut crystal substrate 1 may be slightly tilted to the z-axis of the X-cut crystal substrate 2.

In addition, the x-axis corresponds to an electrical axis, the z-axis corresponds to an optical axis, and the y-axis corresponds to a machine axis.

The thickness, the length, and the width of the vibratory arm section reeds 1a, 1b, and 1c are identical to the thickness, the length, and the width of the vibratory arm section reeds 2a, 2b, and 2c, respectively.

As shown in FIGS. 1 and 2, in a direction vertical to the base upper face 1wu, each size of the vibratory arm section reeds 1a, 1b, 1c, 2a, 2b, and 2c is determined by the thickness D, the length L, and the width W.

The vibratory arm section reed 1a is connected to the vibratory arm section reed 2b so that the faces thereof determined by the length L and the width W are perfectly coincided with each other and stacked.

The vibratory arm section 3a is configured by the vibratory arm section reeds 1a and 2a that are connected to each other as described above.

The vibratory arm section reed 1b is connected to the vibratory arm section reed 2b so that the faces thereof determined by the length L and the width W are perfectly coincided with each other and stacked.

The vibratory arm section 3b is configured by the vibratory arm section reeds 1b and 2b that are connected to each other as described above.

The vibratory arm section reed 1c is connected to the vibratory arm section reed 2c so that the faces thereof determined by the length L and the width W are perfectly coincided with each other and stacked.

The vibratory arm section 3c is configured by the vibratory arm section reeds 1c and 2c that are connected to each other as described above.

The base back face 1wd of the base 1 is connected to the base upper face 2wu of the base 2.

In the vibratory arm section 3a, a drive electrode 4af (first drive electrode) is formed on an upper face perpendicular to the x-axis direction, and a drive electrode 4ab (second drive electrode) is formed on a back face.

In the vibratory arm section 3b, a drive electrode 4bf (first drive electrode) is formed on an upper face perpendicular to the x-axis direction, and a drive electrode 4bb (second drive electrode) is formed on a back face.

In the vibratory arm section 3c, a drive electrode 4cf (first drive electrode) is formed on an upper face perpendicular to the x-axis direction, and a drive electrode 4cb (second drive electrode) is formed on a back face.

An intermediate electrode 4ac is be provided between the vibratory arm section reeds 1a and 2a.

An intermediate electrode 4bc is be provided between the vibratory arm section reeds 1b and 2b.

An intermediate electrode 4cc is be provided between the vibratory arm section reeds 1c and 2c.

An insulating films 5 made of an oxide film or the like is formed so as to be adjacent to each of the intermediate electrodes 4ac, 4bc, and 4cc.

Irregularities in each surface of the intermediate electrodes 4ac, 4bc, and 4cc are removed.

Each of the intermediate electrodes 4ac, 4bc, and 4cc is disposed so as to be sandwiched between the vibratory arm section reeds.

In the above-described vibratory arm sections 3a, 3b, and 3c, the drive electrodes 4af and 4ab, the intermediate electrode 4bc, and the drive electrodes 4cf and 4cb are electrically connected to an electrode 6a.

In contrast, the intermediate electrode 4ac, the drive electrodes 4bf and 4bb, and the intermediate electrode 4cc are electrically connected to an electrode 6b.

That is, the vibratory arm sections 3a, 3b, and 3c are configured so that, in the vibratory arm sections that are adjacent to each other, the phase of voltage between the drive electrodes of one of the vibratory arm sections is inverted (opposite phase) to the phase of voltage between the drive electrodes of the other of the vibratory arm sections.

In addition, vibratory arm sections 3a, 3b, and 3c are configured so that, in the two vibratory arm sections that are adjacent to each other, the phase of voltage between the drive electrodes and the intermediate electrode of one of the vibratory arm sections is inverted (opposite phase) to the phase of voltage between the drive electrodes and the intermediate electrode of the other of the vibratory arm sections.

In other words, the electrodes are configured so that the voltage whose phase is inverted to the phase of voltage supplied to the electrode 6a is generated. Also, the electrodes are configured to become a vibrator in which the vibratory arm sections adjacent to each other vibrate in the opposite directions based on natural frequency (natural mechanical resonance frequency).

In addition, a structure of the three vibratory arm elements constituted of the vibratory arm sections 3a, 3b, and 3c is described as an example in this embodiment. However, the number of the arm elements can be greater than or equal to two, and the number thereof is not limited.

Next, with regard to vibration obtained by the above-described structure, the case of vibrating in, for example, the x-axis direction shown in FIG. 1 will be described.

In the case where the voltage between the drive electrodes 4af and 4ab is greater than the voltage supplied to the intermediate electrodes 4ac in the vibratory arm section 3a, a direction of electric field is directed from the drive electrodes 4af and 4ab to the intermediate electrode 4ac.

Therefore, since the vibratory arm section reed 1a is extended and the vibratory arm section reed 2a is constricted in the y-axis, the vibratory arm section 3a vibrates in the lower direction of FIG. 2 (the x-axis direction).

In addition, in the case where the voltage between the drive electrodes 4af and 4ab is lower than the voltage supplied to the intermediate electrodes 4ac in the vibratory arm section 3a, a direction of electric field is directed from the intermediate electrode 4ac to the drive electrodes 4af and 4ab.

Therefore, since the vibratory arm section reed 1a is constricted and the vibratory arm section reed 2a is extended in the y-axis, the vibratory arm section 3a vibrates in the upper direction of FIG. 2 (the x-axis direction).

Therefore, since an alternating voltage having rectangular wave is supplied to the drive electrodes and the intermediate electrode, x-axis direction, the vibratory arm section 3a vibrates.

The other vibratory arm sections 3b and 3c vibrate in the same manner (action) described above.

As described above, the drive electrodes and the intermediate electrode are connected to the electrodes 6a and 6b so that, in the vibratory arm sections adjacent to each other, the phase of alternating voltage between the drive electrodes and the intermediate electrode in one of the vibratory arm sections is inverted to the phase of alternating voltage between the drive electrodes and the intermediate electrode in the other of the vibratory arm sections.

Consequently, the vibratory arm sections adjacent to each other vibrate in the opposite directions along the x-axis. That is, one of the vibratory arm sections moves in the upper direction and vibrates, and the other of the vibratory arm sections moves in the lower direction and vibrates.

Since the vibratory arm sections adjacent to each other vibrate in the opposite directions, it is difficult to transmit the vibration of the vibratory arm sections to a fixation portion in which the bases 1w and 2w are fixed on the vibratory structure.

In addition, the lack of stability of the vibration of the vibratory arm sections caused by variations in the fixation strength of the vibratory structure is reduced.

Therefore, in the case of producing the vibratory structures in large quantities, even if variations in the fixation strength for fixing the vibratory structure by an adhesive or the like occur, it is possible to reduce variations in the CI values of mass-produced vibratory structures.

Next, a method for manufacturing the vibratory structure shown in FIG. 2 will be described with reference to FIGS. 3A to 3H.

FIGS. 3A to 3H are cross-sectional views illustrating manufacturing processes of the vibratory structure of the first embodiment.

Firstly, each of the intermediate electrodes 4ac, 4bc, and 4cc is formed on the base upper face 2wu of the X-cut crystal substrate 2 so as to correspond to the position on which each of the vibratory arm sections 3a, 3b, and 3c is formed.

Here, as a metal film constituting the intermediate electrodes, a stacked structure constituted of, for example, a chrome (Cr) film whose thickness is 10 nm and a gold (Au) film whose thickness is 50 nm is adopted.

Figure 3A:
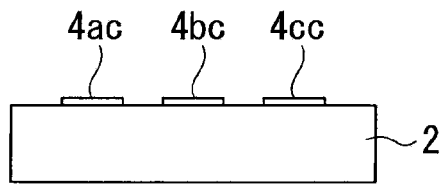
FIGS. 3A to 3H are cross-sectional views illustrating manufacturing processes of the vibratory structure of the first embodiment.

The intermediate electrodes are formed by etching the thin film that is constituted of the chrome (Cr) film and the gold (Au) film (FIG. 3A).

Subsequently, a material of the insulating film 5 is formed on the exposed base upper face 2wu, and on the intermediate electrodes 4ac, 4bc, and 4cc.

Figure 3E:
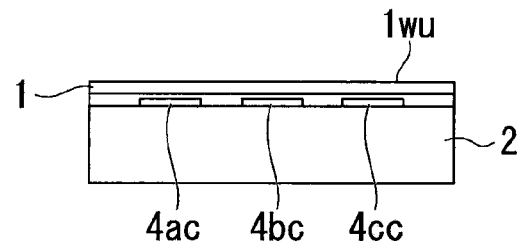
Figure 3B:
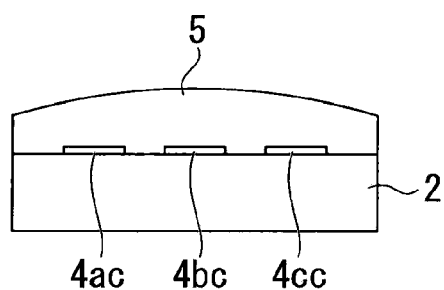

As a method for forming the insulating film 5, for example, a method in which a polysilazane is applied on the base upper face 2wu and the applied polysilazane is converted into an oxide film ($SiO_2$), a CVD (Chemical Vapor Deposition) method, a sputtering method, an evaporation coating method, or the like may be used (FIG. 3B).

Figure 3F:
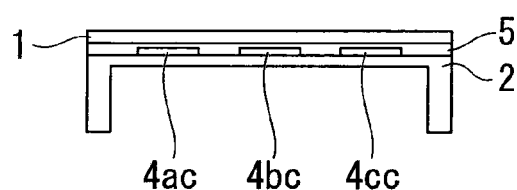
Figure 3C:
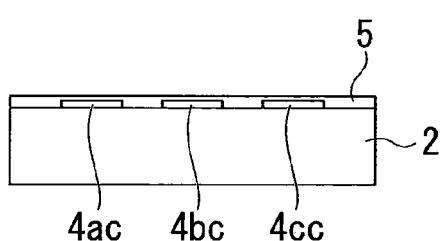

Next, in order to reduce the irregularities of the surface of the intermediate electrodes 4ac, 4bc, and 4cc, or variations in the thickness of the insulating film 5, a polishing treatment is performed so that the insulating film 5 is planarized after the insulating film 5 has been formed (FIG. 3C).

Figure 3G:
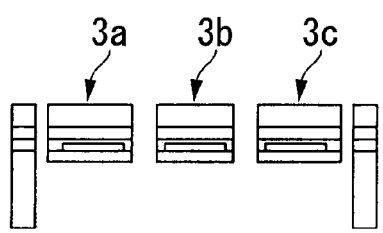
Figure 3D:
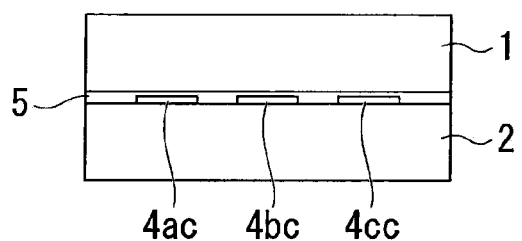

Next, the X-cut crystal substrate 1 is stacked on the X-cut crystal substrate 2 with the intermediate electrodes 4ac, 4bc, and 4cc interposed therebetween so that the base upper face 2wu of the base 2 is connected to the base back face 1wd (FIG. 3D).

Thereafter, the thickness of the X-cut crystal substrate 1 that has been stacked on the X-cut crystal substrate 2 is reduced by polishing the base upper face 1wu so that the X-cut crystal substrate 1 becomes a plate having a predetermined thickness, for example 6.3 μm (FIG. 3E).

Therefore, it is possible to determine the length of the vibratory arm section in the longitudinal direction and the film thickness defining the oscillating frequency with a high level of machining precision, and thinly form the vibratory arm sections.

As a result, variations in the CI values of mass-produced vibratory structures are suppressed, and it is possible to easily realize downsizing of the vibratory structure.

Next, in portions of the base back face 2wd on which the vibratory arm sections 3a, 3b, and 3c are formed, the base back face 2wd of the base 2w is etched so that the X-cut crystal substrate 2 has the same thickness as the X-cut crystal substrate 1, for example 6.3 μm.

That is, a region (formation region) on which the vibratory arm sections 3a, 3b, and 3c are formed in the base 2w is etched.

In this etching process, the X-cut crystal substrate 2 is etched so as to cause the side wall sections of the X-cut crystal substrates 1 and 2 to be remained. The side wall sections are sections at which vibratory arm sections are not formed in the sections that are extended from the base 2w.

The side wall sections are the sections that extend so as to be parallel to the longitudinal direction of each of the vibratory arm sections.

By forming a groove as described above, the X-cut crystal substrates 1 and 2 having an inverted-mesa form are formed (FIG. 3F).

As an etching method, a micro blast method, a dry etching method using plasma, a laser working method, or the like are used.

Next, the X-cut crystal substrates 1 and 2 are etched so as to separate into the vibratory arm sections 3a, 3b, and 3c.

Specifically, a photo-sensitive film is applied on the X-cut crystal substrate 1 and the applied photo-sensitive film is cured. By exposing and developing the photo-sensitive film, the resist pattern is formed corresponding to the form of the vibratory arm sections 3a, 3b, and 3c in a plan view.

Thereafter, by etching the bases 1w and 2w using the resist pattern as a mask, X-cut crystal substrates 1 and 2 are separated into the vibratory arm sections 3a, 3b, and 3c (FIG. 3G).

Here, since the bases 1w and 2w are made of quartz crystal and the composition of the quartz crystal is $SiO_2$, a dry etching method using a fluorine system gas is used.

As a result, the vibratory arm sections 3a, 3b, and 3c, each of which has each of the intermediate electrodes 4ac, 4bc, and 4cc, are formed.

Alternatively, in the process for separating into the vibratory arm sections 3a, 3b, and 3c, a mask may be formed using a metal film constituted of nickel (Ni) or aluminum (Al), and the vibratory arm sections 3a, 3b, and 3c may be formed using the metal mask.

In this case, the above-described metal film is formed on the X-cut crystal substrate 1, a resist pattern is formed on the metal film using the above-described method, and a metal mask is formed by etching via the resist pattern.

Thereafter, by etching the base 1w, 2w via the metal mask, the vibratory arm sections 3a, 3b, and 3c are separated.

Next, the drive electrodes 4af, 4bf, and 4cf are formed on an upper face (top face) of the vibratory arm sections 3a, 3b, and 3c, respectively.

In addition, the drive electrodes 4ab, 4bb, and 4cb are formed on a back face (under face) of the vibratory arm sections 3a, 3b, and 3c, respectively.

Specifically, a metal film, that is, a stacked film constituted of a thin film made of a chrome whose thickness is 50 nm and a thin film made of gold whose thickness is 50 nm is formed on the upper face and the back face of the vibratory arm sections 3a, 3b, and 3c. A photo-sensitive film is applied on a surface of the stacked film.

The photo-sensitive film is treated by the processes such as curing, exposure, and development, and the photo-sensitive film thereby has the resist pattern corresponding to the form of the described-above drive electrodes in a plan view.

Figure 3H:
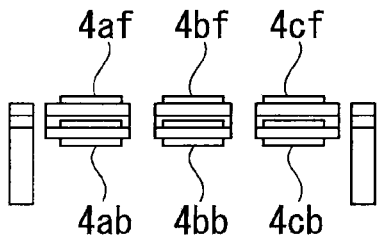

Thereafter, by etching the stacked film that is constituted of the chrome and the gold using the resist pattern as a mask, the drive electrodes 4af, 4ab, 4bf, 4bb, 4cf, and 4cb are formed (FIG. 3H).

In addition, in FIG. 3G, metal films constituting the drive electrodes may be formed on the X-cut crystal substrates 1 and 2 before separating the vibratory arm sections 3a, 3b, and 3c. In this case, by etching the metal films and the bases 1w and 2w so as to form the drive electrodes 4af, 4ab, 4bf, 4bb, 4cf, and 4cb, the vibratory arm sections 3a, 3b, and 3c respectively having the drive electrodes are formed.

Modified Example of First Embodiment

Next, a modified example of the first embodiment is described with reference to FIG. 4.

Figure 4:
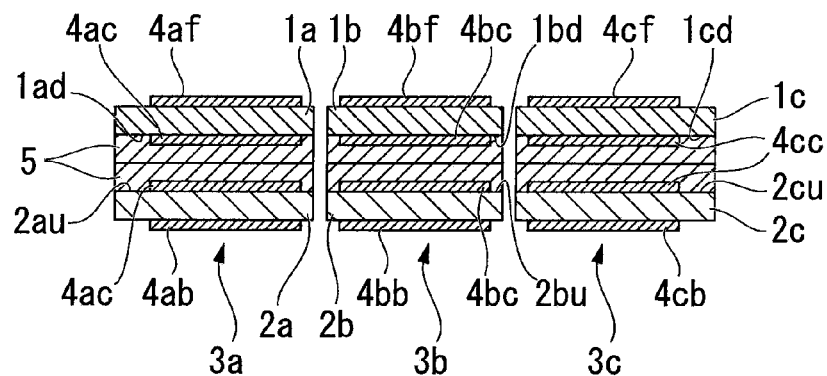
FIG. 4 is a cross-sectional view showing the vibratory structure of a modified example of the first embodiment taken along the line A-A shown in FIG. 1.

FIG. 4 is a cross-sectional view showing the vibratory structure of a modified example of the first embodiment taken along the line A-A shown in FIG. 1.

As shown in FIG. 4, in a tuning-fork type vibratory structure of this modified example, two intermediate electrodes (first intermediate electrode and second intermediate electrode) are provided in each of the vibratory arm sections 3a, 3b, and 3c Specifically, in the vibratory arm sections 3a, one of the intermediate electrodes 4ac is formed on an upper face 2au of the vibratory arm section reed 2a, and the other thereof is formed on the back face 1ad of the vibratory arm section reed 1a.

In addition, in the vibratory arm sections 3b, one of the intermediate electrodes 4bc is formed on an upper face 2bu of the vibratory arm section reed 2b, and the other thereof is formed on the back face 1bd of the vibratory arm section reed 1b.

In addition, in the vibratory arm sections 3c, one of the intermediate electrodes 4cc is formed on an upper face 2cu of the vibratory arm section reed 2c, and the other thereof is formed on the back face 2cd of the vibratory arm section reed 1c.

In addition, the insulating films 5 are respectively formed on the upper faces of the vibratory arm section reeds 2a, 2b, and 2c, and the back faces of the vibratory arm section reeds 1a, 1b, and 1c so as to cover the intermediate electrodes 4ac, 4bc, and 4cc. Furthermore, the insulating films 5 formed on the back face 1ad, 1bd, and 1cd are respectively connected to the insulating films 5 formed on the back face 2au, 2bu, and 2cu.

In this structure, a couple of the intermediate electrodes 4ac are disposed so as to face each other with the insulating film 5 interposed therebetween, a couple of the intermediate electrodes 4bc are disposed so as to face each other with the insulating film 5 interposed therebetween, and a couple of the intermediate electrodes 4cc are disposed so as to face each other with the insulating film 5 interposed therebetween.

Next, a method for manufacturing the tuning-fork type vibratory structure having each of the vibratory arm sections 3a, 3b, and 3c in which the two intermediate electrodes are provided will be described.

Firstly, the X-cut crystal substrate 1 is processed in the same processes in which the X-cut crystal substrate 2 is processed as shown in FIGS. 3A, 3B, and 3C.

Therefore, the intermediate electrodes 4ac, 4bc, and 4cc are formed on the base back face 1wd of the first X-cut crystal substrate 1.

In addition, a polishing treatment is performed in order to planarize the insulating film 5.

Thus, the first X-cut crystal substrate 1 in which the intermediate electrodes 4ac, 4bc, and 4cc have been formed on the base back face 1wd is prepared.

Thereafter, the X-cut crystal substrate 1 is stacked on the X-cut crystal substrate 2 so that the positions of the intermediate electrodes 4ac, 4bc, and 4cc that have been formed on the base back face 1wd are coincided with the intermediate electrodes 4ac, 4bc, and 4cc that have been formed on the base upper face 2wu.

As a result, each of vibratory arm section reeds 1a, 1b, 1c, 2a, 2b, and 2c is formed so as to have the drive electrodes and intermediate electrodes.

In the modified example, each vibratory arm section is configured so that an alternating voltage with a coordinate phase is supplied to the drive electrodes and an alternating voltage with a coordinate phase is supplied to the intermediate electrodes.

Next, the vibration characteristics of the vibratory structure formed in the manufacturing processes shown in FIGS. 3A to 3H will be described.

Figure 5:
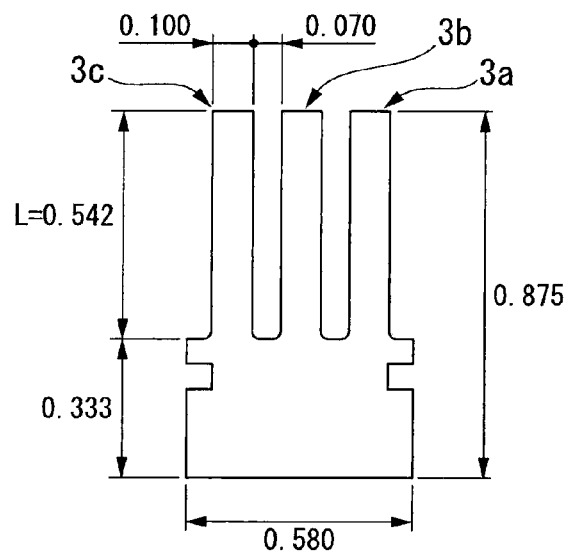
FIG. 5 is a top view showing the vibratory structure of the first embodiment in a direction perpendicular to a base upper face.

FIG. 5 is a top view showing the vibratory structure of the first embodiment in a direction perpendicular to a base upper face 1*wu*.

In the case where the vibratory structure formed in the manufacturing processes shown in FIGS. 3A to 3H has the form and sizes shown in FIG. 5, the CI (Crystal Impedance) value can be realized to be less than or equal to 150 kΩ, and the Q value can be realized to be greater than or equal to 4000.

In FIG. 5, unit of each dimension is mm, the length L of the vibratory arm section is 0.542 mm. In addition, the thickness D of each vibratory arm section is 12.6 μm.

In this structure, a quartz crystal vibrator whose oscillating frequency is 32.768 KHz can be formed.

Figure 6:
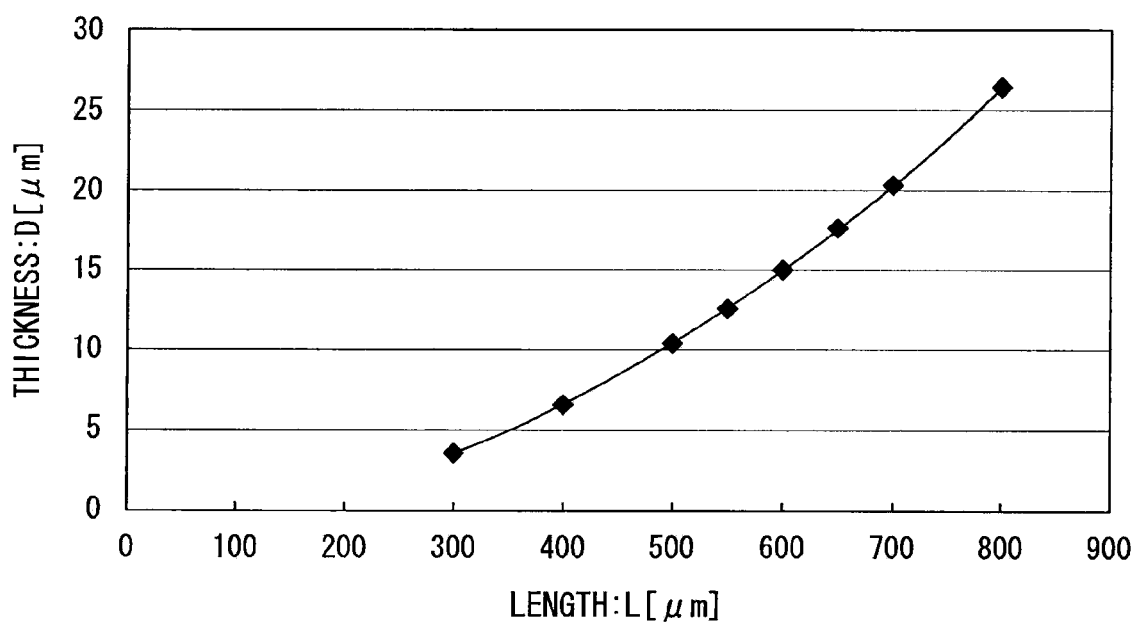
FIG. 6 is a diagram showing the relationship between the length L and the thickness D of the vibratory arm section in order to obtain the natural frequency of 32.768 KHz in the vibratory structure of the first embodiment.

The relationship between the length L and the thickness D in the vibratory arm section corresponding to this frequency is shown in FIG. 6.

It is understood that the vibration characteristics can obtain $f \propto D/L^2$.

In addition, by using the quartz crystal as a piezoelectric material, the vibratory structure can have two-dimensional temperature characteristics.

In addition, by shifting a cut angle of the X-cut crystal substrate to any of the x-axis and the y-axis, or both the x-axis and the y-axis, it is possible to adjust the top temperature (maximal value of temperature) in the temperature characteristics.

Second Embodiment

Next, a quartz crystal vibratory structure of a second embodiment of the invention will be described with reference to drawings.

Figure 7:
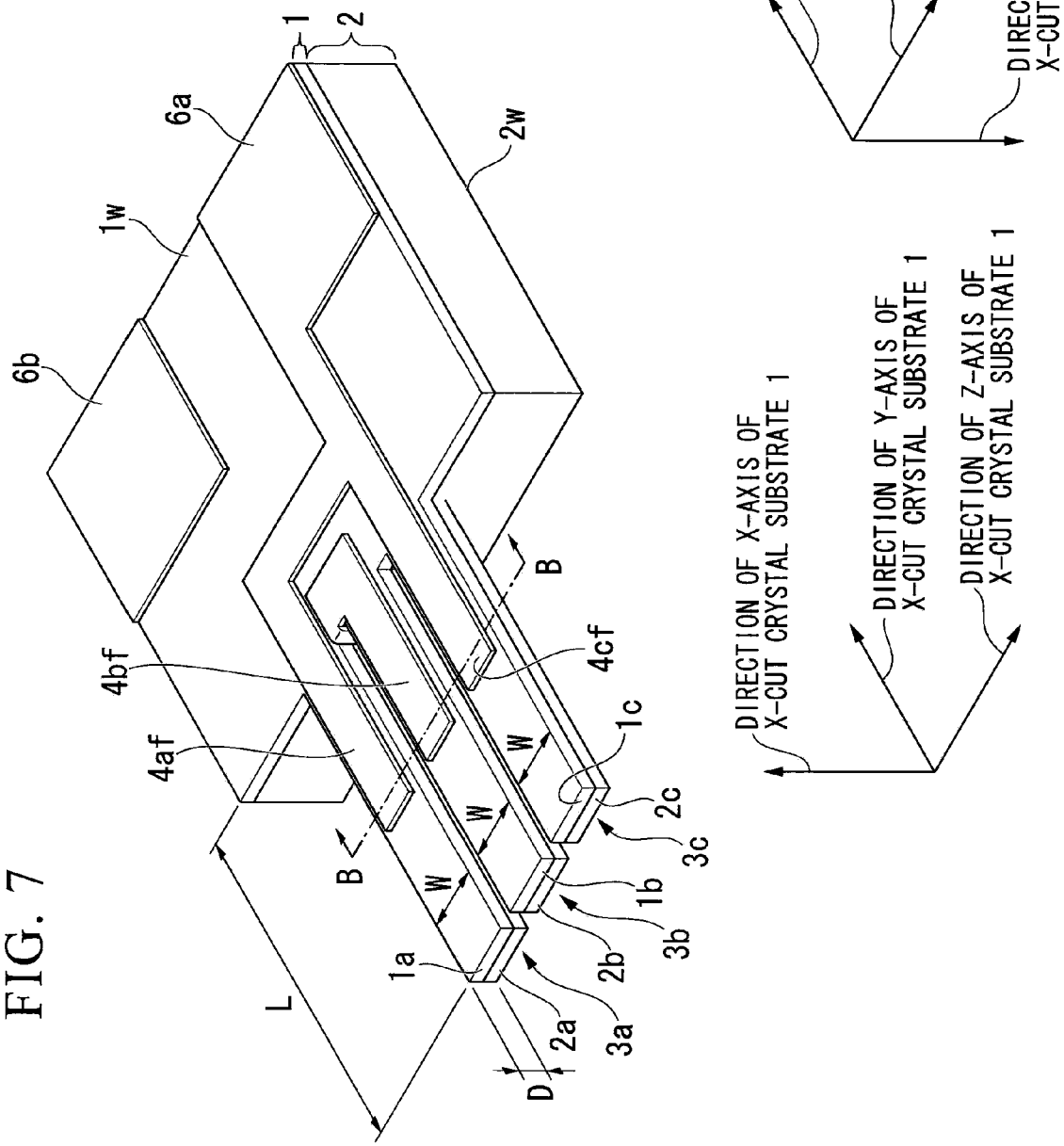
FIG. 7 is a perspective view showing an example structure of a vibratory structure of a second embodiment of the invention.

FIG. 7 is a perspective view showing a tuning-fork type vibratory structure of the second embodiment of the invention.

FIG. 8 is a cross-sectional view showing the tuning-fork type vibratory structure of the second embodiment of the invention.

In the second embodiment, identical symbols are used for the structures which are identical to those of the first embodiment, and structures and actions different form the first embodiment are described.

The tuning-fork type vibratory structure of this embodiment is constituted of the X-cut crystal substrates 1 and 2. Each of the X-cut crystal substrates 1 and 2 is an X plate (X-cut) whose main face is orthogonal to the x-axis in the crystal axis (xyz).

In the crystal axis (xyz), the X-cut crystal substrates 1 and 2 are stacked and connected to each other so that the x-axis of crystal of the X-cut crystal substrate 1 is parallel to that of the X-cut crystal substrate 2.

In addition, the x-axis direction of the first X-cut crystal substrate 1 is inverted to the x-axis direction of the second X-cut crystal substrate 2.

That is, the positive x-axis direction of the X-cut crystal substrate 1 is coincided with the negative x-axis direction of the X-cut crystal substrate 2.

The x-axis of the X-cut crystal substrate 1 may be substantially parallel to the x-axis of the X-cut crystal substrate 2, and the x-axis of the X-cut crystal substrate 1 may be slightly tilted to the x-axis of the X-cut crystal substrate 2.

Here, as the crystal used for the X-cut crystal substrates 1 and 2, an identical crystal system is used, and any of the right-hand system crystal or the left-hand system crystal may be used.

The X-cut crystal substrates 1 and 2 stacked to each other have the same structure as the first embodiment, except for the structure in which the x-axis direction of the first X-cut crystal substrate 1 is inverted to the x-axis direction of the second X-cut crystal substrate 2

In the vibratory arm section reeds 1*a*, 1*b*, 1*c*, 2*a*, 2*b*, and 2*c* of the tuning-fork type vibrator of this embodiment, the x-axis direction (vibration direction) of the crystal axis (xyz) corresponds to the thickness thereof, the y-axis direction corresponds to the length thereof in the longitudinal direction, and z-axis direction corresponds to the width thereof in the lateral direction.

In a manner similar to that of the first embodiment, the X-cut crystal substrates 1 and 2 are stacked and connected so that the y-axis and z-axis of the X-cut crystal substrate 1 are parallel to the y-axis and z-axis of the X-cut crystal substrate 2, respectively.

The y-axis of the X-cut crystal substrate 1 may be substantially parallel to the y-axis of the X-cut crystal substrate 2, and the y-axis of the X-cut crystal substrate 1 may be slightly tilted to the y-axis of the X-cut crystal substrate 2.

In addition, the x-axis corresponds to an electrical axis, the z-axis corresponds to an optical axis, and the y-axis corresponds to a machine axis.

The thickness, the length, and the width of the vibratory arm section reeds 1*a*, 1*b*, and 1*c* are identical to the thickness, the length, and the width of the vibratory arm section reeds 2*a*, 2*b*, and 2*c*, respectively.

As shown in FIGS. 7 and 8, in a direction vertical to the base upper face 1*wu*, each size of the vibratory arm section reeds 1*a*, 1*b*, 1*c*, 2*a*, 2*b*, and 2*c* is determined by the thickness D, the length L, and the width W.

The vibratory arm section reed 1*a* is connected to the vibratory arm section reed 2*b* so that the faces thereof determined by the length L and the width W are perfectly coincided with each other and stacked.

The vibratory arm section 3*a* is configured by the vibratory arm section reeds 1*a* and 2*a* that are connected to each other as described above.

The vibratory arm section reed 1*b* is connected to the vibratory arm section reed 2*b* so that the faces thereof determined by the length L and the width W are perfectly coincided with each other and stacked.

The vibratory arm section 3*b* is configured by the vibratory arm section reeds 1*b* and 2*b* that are connected to each other as described above.

The vibratory arm section reed 1*c* is connected to the vibratory arm section reed 2*c* so that the faces thereof determined by the length L and the width W are perfectly coincided with each other and stacked.

The vibratory arm section 3*c* is configured by the vibratory arm section reeds 1*c* and 2*c* that are connected to each other as described above.

The base back face 1*wd* of the base 1 is connected to the base upper face 2*wu* of the base 2 by, for example a direct connection.

In the vibratory arm section 3*a*, a drive electrode 4*af* (first drive electrode) is formed on an upper face perpendicular to the x-axis direction, and a drive electrode 4*ab* (second drive electrode) is formed on a back face.

In the vibratory arm section 3*b*, a drive electrode 4*bf* (first drive electrode) is formed on an upper face perpendicular to the x-axis direction, and a drive electrode 4*bb* (second drive electrode) is formed on a back face.

In the vibratory arm section 3*c*, a drive electrode 4*cf* (first drive electrode) is formed on an upper face perpendicular to the x-axis direction, and a drive electrode 4*cb* (second drive electrode) is formed on a back face.

In the second embodiment different from the first embodiment, the intermediate electrodes are not formed in the vibratory arm sections 3*a*, 3*b*, and 3*c*.

In the above-described vibratory arm sections 3*a*, 3*b*, and 3*c*, the drive electrodes 4*af*, 4*bb*, and 4*cf* are electrically connected to each other.

In contrast, the drive electrodes 4*ab*, 4*bf*, and 4*cb* are electrically connected to each other.

That is, the vibratory arm sections 3*a*, 3*b*, and 3*c* are configured so that, in the two vibratory arm sections that are adjacent to each other, the phase of voltage supplied to one of the vibratory arm sections is inverted (opposite phase) to the phase of voltage supplied to the other of the vibratory arm sections.

In this embodiment, a structure of the three vibratory arm elements constituted of the vibratory arm sections 3*a*, 3*b*, and 3*c* is described as an example. However, the number of the arm elements can be greater than or equal to two, and the number thereof is not limited.

Next, with regard to vibration obtained by the above-described structure, the case of vibrating in, for example, the x-axis direction shown in FIGS. 7 and 8 will be described.

In the case where the voltage between the drive electrode 4*ab* is greater than the voltage supplied to the drive electrode 4*af* in the vibratory arm section 3*a*, a direction of electric field is directed from the drive electrode 4*ab* to the drive electrode 4*af*.

Therefore, since the vibratory arm section reed 1*a* is extended and the vibratory arm section reed 2*a* is constricted in the y-axis, the vibratory arm section 3*a* vibrates in the lower direction of FIG. 8 (the x-axis direction).

In addition, in the case where the voltage between the drive electrode 4*ab* is lower than the voltage supplied to the drive electrode 4*af* in the vibratory arm section 3*a*, a direction of electric field is directed from the drive electrode 4*af* to the drive electrode 4*ab*.

Therefore, since the vibratory arm section reed 1*a* is constricted and the vibratory arm section reed 2*a* is extended in the y-axis, the vibratory arm section 3*a* vibrates in the upper direction of FIG. 8 (the x-axis direction).

The other vibratory arm sections 3*b* and 3*c* vibrate in the same manner (action) described above.

As described above, the drive electrodes are connected to the electrodes 6*a* and 6*b* so that, in the vibratory arm sections adjacent to each other, the phase of alternating voltage between the drive electrodes in one of the vibratory arm sections is inverted to the phase of alternating voltage between the drive electrodes in the other of the vibratory arm sections.

Consequently, the vibratory arm sections adjacent to each other vibrate in the opposite directions along the x-axis. That is, one of the vibratory arm sections moves in the upper direction and vibrates, and the other of the vibratory arm sections moves in the lower direction and vibrates.

In a manner similar to that of the first embodiment, since the vibratory arm sections adjacent to each other vibrate in the opposite directions, it is difficult to transmit the vibration of the vibratory arm sections to a fixation portion in which the bases 1*w* and 2*w* are fixed on the vibratory structure.

In addition, the lack of stability of the vibration of the vibratory arm sections caused by variations in the fixation strength of the vibratory structure is reduced.

Therefore, in the case of producing the vibratory structures in large quantities, even if variations in the fixation strength for fixing the vibratory structure by an adhesive or the like occur, it is possible to reduce variations in the CI values of mass-produced vibratory structures.

Next, a method for manufacturing the vibratory structure shown in FIG. 8 will be described with reference to FIGS. 9A to 9D.

FIGS. 9A to 9D are perspective views illustrating manufacturing processes of the vibratory structure of this embodiment.

Firstly, a surface of the base back face 1*wd* of the X-cut crystal substrate 1 and a surface of the base upper face 2*wu* of the X-cut crystal substrate 2 are activated.

Thereafter, the X-cut crystal substrate 1 is stacked on the X-cut crystal substrate 2 so that the base back face 1*wd* is contacted with the base upper face 2*wu*.

Thereafter, the X-cut crystal substrate 1 is directly connected with the X-cut crystal substrate 2 under a predetermined atmosphere in which pressure and temperature are set (FIG. 9 A).

Here, when the surface of the above-described base back face 1*wd* and the surface of the above-described base upper face 2*wu* are activated, HF solution, a dry etching using plasma, or the like may be used.

In addition, the above-described base back face 1*wd* may be connected with the above-described base upper face 2*wu* by plasma polymerization.

Figure 9A:
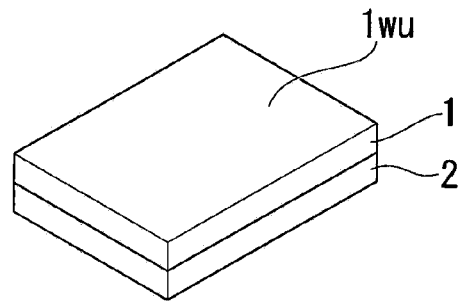
FIGS. 9A to 9D are perspective views illustrating manufacturing processes of the vibratory structure of the second embodiment.
Figure 9B:
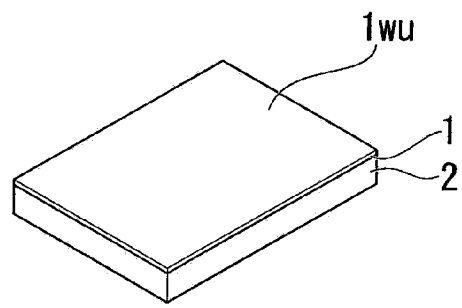
Figure 9C:
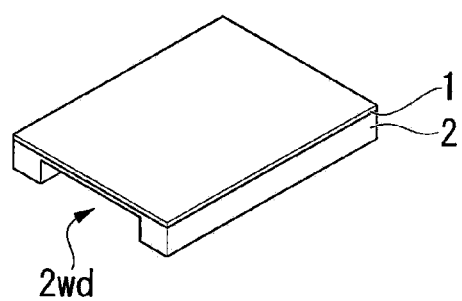
Figure 9D:
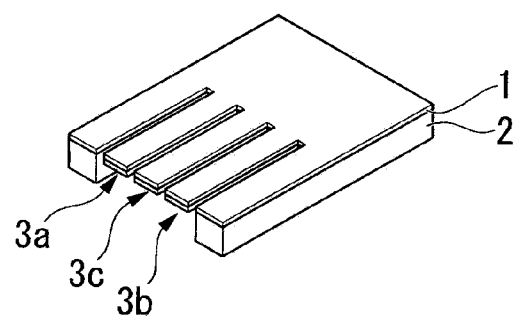

Next, the thickness of the X-cut crystal substrate 1 that has been stacked on the X-cut crystal substrate 2 is reduced by polishing the base upper face 1*wu* so that the X-cut crystal substrate 1 becomes a plate having a predetermined thickness, for example 6.3 μm (FIG. 9B).

In a similar case of the first embodiment, it is possible to determine the length of the vibratory arm section in the longitudinal direction and the film thickness defining the oscillating frequency with a high level of machining precision, and thinly form the vibratory arm sections.

As a result, variations in the CI values of mass-produced vibratory structures are suppressed, and it is possible to easily realize downsizing of the vibratory structure.

Next, in portions of the base back face 2*wd* on which the vibratory arm sections 3*a*, 3*b*, and 3*c* are formed, the base back face 2*wd* of the base 2*w* is etched so that the X-cut crystal substrate 2 has the same thickness as the X-cut crystal substrate 1, for example 6.3 μm.

That is, a region (formation region) on which the vibratory arm sections 3*a*, 3*b*, and 3*c* are formed in the base 2*w* is etched.

In this etching process, the X-cut crystal substrate 2 is etched so as to cause the side wall sections of the X-cut crystal substrates 1 and 2 to be remained. The side wall sections are sections at which vibratory arm sections are not formed in the sections that are extended from the base 2*w*.

The side wall sections are the sections that extend so as to be parallel to the longitudinal direction of each of the vibratory arm sections.

By forming a groove as described above, the X-cut crystal substrates 1 and 2 having an inverted-mesa form are formed (FIG. 9 C).

As an etching method, a micro blast method, a dry etching method using plasma, a laser working method, or the like are used.

Next, the X-cut crystal substrates 1 and 2 are etched so as to separate into the vibratory arm sections 3a, 3b, and 3c.

Specifically, a photo-sensitive film is applied on the X-cut crystal substrate 1 and the applied photo-sensitive film is cured. By exposing and developing the photo-sensitive film, the resist pattern is formed corresponding to the form of the vibratory arm sections 3a, 3b, and 3c in a plan view.

Thereafter, by etching the bases 1w and 2w using the resist pattern as a mask, X-cut crystal substrates 1 and 2 are separated into the vibratory arm sections 3a, 3b, and 3c (FIG. 9 D).

Here, since the bases 1w and 2w are made of quartz crystal and the composition of the quartz crystal is $SiO_2$, a dry etching method using a fluorine system gas is used.

As a result, the vibratory arm section 3a constituted of the vibratory arm section reeds 1a and 2a, the vibratory arm section 3b constituted of the vibratory arm section reeds 1b and 2b, and the vibratory arm section 3c constituted of the vibratory arm section reeds 1c and 2c are formed.

Alternatively, in the process for separating into the vibratory arm sections 3a, 3b, and 3c, as described with reference to FIG. 3G, the vibratory arm sections 3a, 3b, and 3c may be formed using a metal mask.

Next, the drive electrodes 4af, 4bf, and 4cf are formed on an upper face (top face) of the vibratory arm sections 3a, 3b, and 3c, respectively, in a manner similar to that of the first embodiment.

In addition, the drive electrodes 4ab, 4bb, and 4cb are formed on a back face (under face) of the vibratory arm sections 3a, 3b, and 3c, respectively.

Specifically, a metal film, that is, a stacked film constituted of a thin film made of a chrome whose thickness is 50 nm and a thin film made of gold whose thickness is 50 nm is formed on the upper face and the back face of the vibratory arm sections 3a, 3b, and 3c. A photo-sensitive film is applied on a surface of the stacked film.

The photo-sensitive film is treated by the processes such as curing, exposure, and development, and the photo-sensitive film thereby has the resist pattern corresponding to the form of the described-above drive electrodes in a plan view.

Thereafter, by etching the stacked film that is constituted of the chrome and the gold using the resist pattern as a mask, the drive electrodes 4af, 4ab, 4bf, 4bb, 4cf, and 4cb are formed (FIG. 8).

In addition, in FIG. 9 D, metal films constituting the drive electrodes may be formed on the X-cut crystal substrates 1 and 2 before separating the vibratory arm sections 3a, 3b, and 3c in a manner similar to that of the first embodiment. In this case, by etching the metal films and the bases 1w and 2w so as to form the drive electrodes 4af, 4ab, 4bf, 4bb, 4cf, and 4cb, the vibratory arm sections 3a, 3b, and 3c respectively having the drive electrodes are formed.

Third Embodiment

Next, a quartz crystal vibratory structure of a third embodiment of the invention will be described with reference to drawings.

Figure 10:
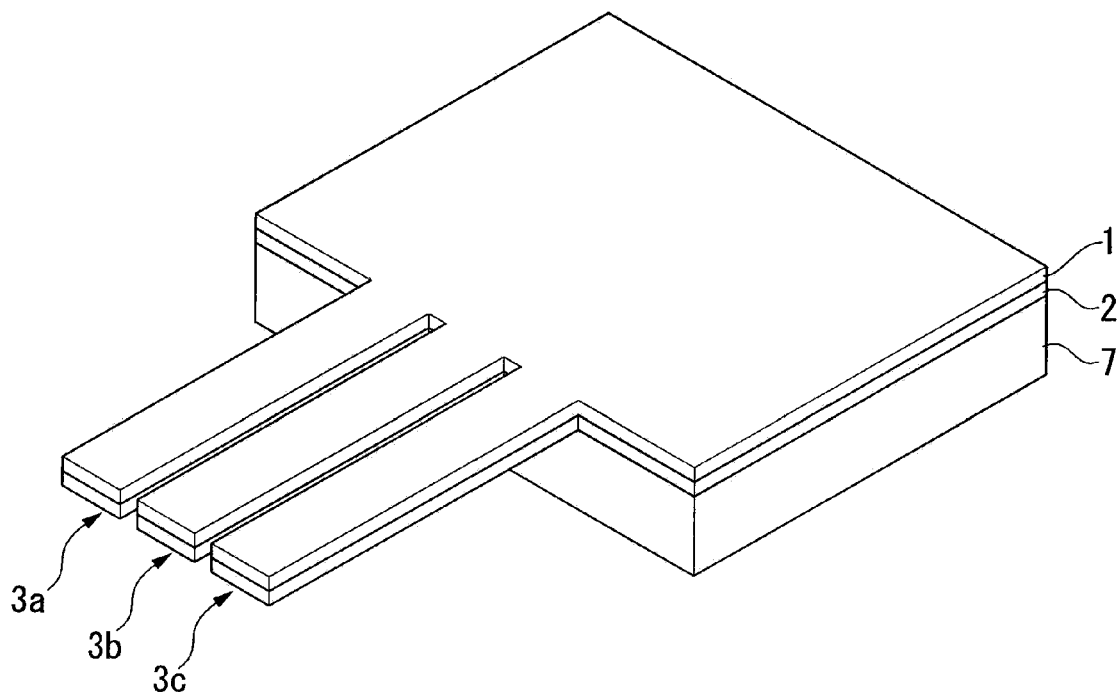
FIG. 10 is a perspective view showing an example structure of a vibratory structure of a third embodiment of the invention.

FIG. 10 is a perspective view showing a structure of a vibratory structure of the third embodiment of the invention.

As shown in FIG. 10, the tuning-fork type vibratory structure of the third embodiment includes a structure in which the above-described X-cut crystal substrates 1 and 2 are provided on a base 7.

Specifically, the thickness of the X-cut crystal substrates 1 and 2 are reduced by etching or polishing each of the X-cut crystal substrates 1 and 2 so that the thickness of each of the X-cut crystal substrates 1 and 2 is the same thickness of each vibratory arm section reed in the first and the second embodiments, for example, 6.3 μm. The X-cut crystal substrates 1 and 2 are disposed on the base 7.

Therefore, in third embodiment, the base of the vibratory structure is constituted of the base 7, the base 1w, and the base 2w.

A Z-cut quartz crystal is used as the above-described base 7.

In addition, the z-axis direction of the base 7 is coincide with the thickness direction of the base 7.

It is not necessary to consider the x-axis direction and the y-axis direction of the base 7.

In addition, as a structure of the vibratory arm sections 3a, 3b, and 3c, the structure of any of the first embodiment or the second embodiment is used.

Next, a method for manufacturing the vibratory structure shown in FIG. 10 will be described with reference to FIGS. 11A and 11B.

Figure 11A:
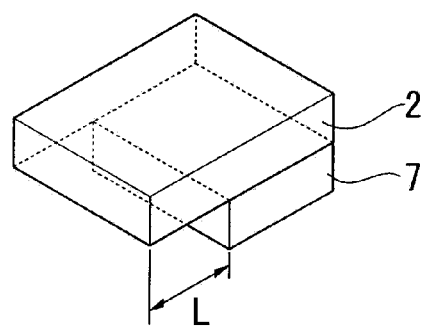
FIGS. 11A and 11B are perspective views illustrating manufacturing processes of the vibratory structure of the third embodiment.
Figure 11B:
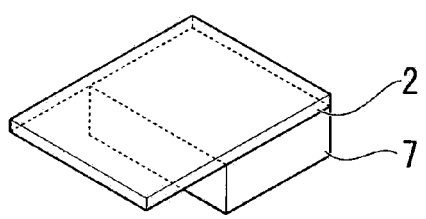

FIGS. 11A and 11B are perspective views illustrating manufacturing processes of the vibratory structure of this embodiment.

Firstly, a base 7 and a X-cut crystal substrate 2 are prepared.

Here, the X-cut crystal substrate 2 is formed so that the region in which the vibratory arm section reeds 2a, 2b, and 2c are formed protrudes from an end portion of the base 7. The base 7 is a quartz crystal substrate.

That is, the X-cut crystal substrate 2 is formed so that the region in which the vibratory arm section reeds 2a, 2b, and 2c are formed protrudes from the end portion of the base 7 by the length L.

Next, the X-cut crystal substrate 2 is stacked on and connected with the base 7 (FIG. 11A).

Thereafter, in the similar case of the first embodiment, the thickness of the X-cut crystal substrate 2 that has been stacked on the base 7 is reduced by polishing the base upper face 2wu so that the X-cut crystal substrate 2 becomes a plate having a predetermined thickness, for example 6.3 μm (FIG. 11B).

Subsequent manufacturing processes are similar to the above-described processes of the first and the second embodiments, except for the point in which the X-cut crystal substrate 2 is not etched so as to reduce the thickness thereof to be 6.3 μm.

Fourth Embodiment

Next, a vibrator of a fourth embodiment of the invention will be described with reference to drawings.

Figure 12:
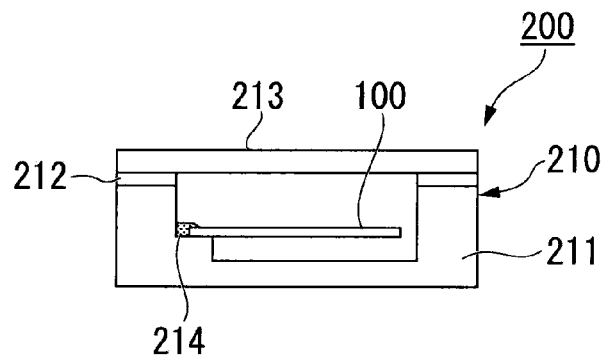
FIG. 12 is a schematic cross-sectional view showing the structure of a ceramic package tuning-fork type vibrator of a fourth embodiment of the invention.

FIG. 12 is a schematic cross-sectional view showing a ceramic package tuning-fork type vibrator 200, that is a vibrator of a fourth embodiment of the invention.

This ceramic package tuning-fork type vibrator 200 uses the tuning-fork type quartz crystal vibratory structure 100 that is any of the vibratory structure of the above-described first, second, and third embodiments.

Therefore, identical symbols are used for the structures which are identical to the tuning-fork type quartz crystal vibratory structure 100, and the explanations thereof are omitted.

FIG. 12 is a schematic cross-sectional view showing the structure of a ceramic package tuning-fork type vibrator 200.

As shown in FIG. 12, the ceramic package tuning-fork type vibrator 200 includes a box-like package 210 having space inside thereof.

The package 210 has a base section 211 at the bottom thereof.

The base section 211 is constituted of ceramics such as an alumina or the like.

A sealing section 212 is provided on the base section 211, and the sealing section 212 is constituted of the same material as the base section 211.

In addition, a flap member 213 is disposed on an upper portion of the sealing section 212.

A hollow box body is constituted of the base section 211, the sealing section 212, and the flap member 213.

In the package 210 formed in the described above manner, a package electrode 214 is provided on the base section 211.

A fixed region 111 of a base 110 of the tuning-fork type quartz crystal vibratory structure 100 is fixed on the package electrodes 214 via a conductive adhesive or the like.

Since the tuning-fork type quartz crystal vibratory structure 100 includes any of the structures of the first, second, and third embodiments as described above, the vibratory structure is downsized, and variations in the CI values of mass-produced vibratory structures are stabilized.

Consequently, the ceramic package tuning-fork type vibrator 200 in which this vibratory structure is provided is also downsized, and it is possible to realize a vibrator with high performance, in which variations in the CI values of mass-produced vibratory structures are stabilized.

Fifth Embodiment

Next, an oscillator of a fifth embodiment of the invention will be described with reference to drawings.

Figure 13:
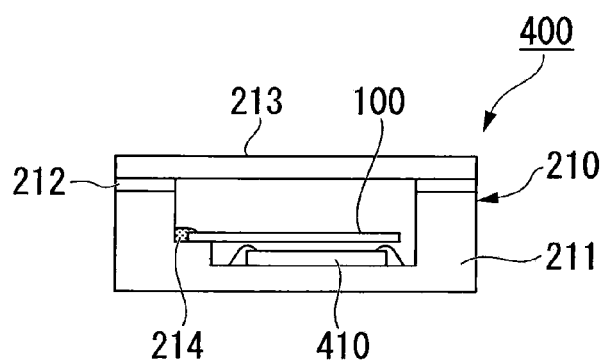
FIG. 13 is a schematic cross-sectional view showing the structure of a tuning-fork quartz crystal oscillator of a fifth embodiment of the invention.

FIG. 13 is a schematic cross-sectional view showing a tuning-fork quartz crystal oscillator 400, that is an oscillator of the fifth embodiment of the invention.

The digital tuning-fork quartz crystal oscillator 400 has structures in common to the above-described ceramic package tuning-fork type vibrator 200 of the fourth embodiment.

Therefore, identical symbols are used for the structures which are identical to the ceramic package tuning-fork type vibrator 200 and the tuning-fork type quartz crystal vibratory structure 100, and the explanations thereof are omitted.

The tuning-fork type quartz crystal oscillator 400 shown in FIG. 13 has an integrated circuit 410. The integrated circuit 410 is disposed under the tuning-fork type quartz crystal vibratory structure 100 in the ceramic package tuning-fork vibrator 200 shown in FIG. 12, and on the base section 211.

That is, in the tuning-fork quartz crystal oscillator 400, when the tuning-fork type quartz crystal vibratory structure 100 disposed inside of the tuning-fork quartz crystal oscillator 400 vibrates, a signal obtained by this vibration is input to the integrated circuit 410. Thereafter, by extracting a predetermined frequency signal from the integrated circuit 410, the tuning-fork quartz crystal oscillator 400 functions as an oscillator.

That is, since the tuning-fork type quartz crystal vibratory structure 100 that is contained in the tuning-fork quartz crystal oscillator 400 includes any of the structures of the first, second, and third embodiments, the vibratory structure is downsized, and variations in the CI values of mass-produced vibratory structures are stabilized.

Consequently, the digital tuning-fork quartz crystal oscillator 400 in which this vibratory structure is provided is also downsized, and it is possible to realize an oscillator with high performance, in which variations in the CI values of mass-produced vibratory structures are stabilized.

Sixth Embodiment

Next, an oscillator of a sixth embodiment of the invention will be described with reference to drawings.

Figure 14:
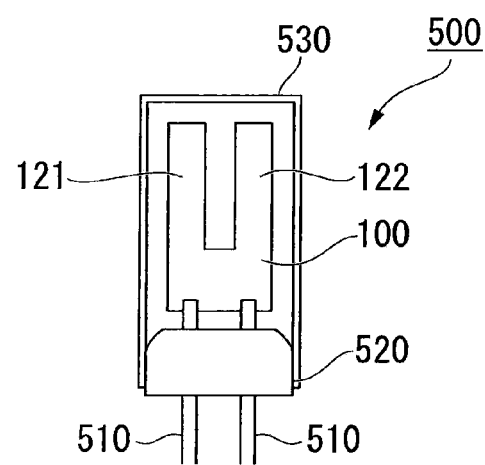
FIG. 14 is a schematic cross-sectional view showing the structure of a cylinder type tuning-fork vibrator of a sixth embodiment of the invention.
Figure 15:
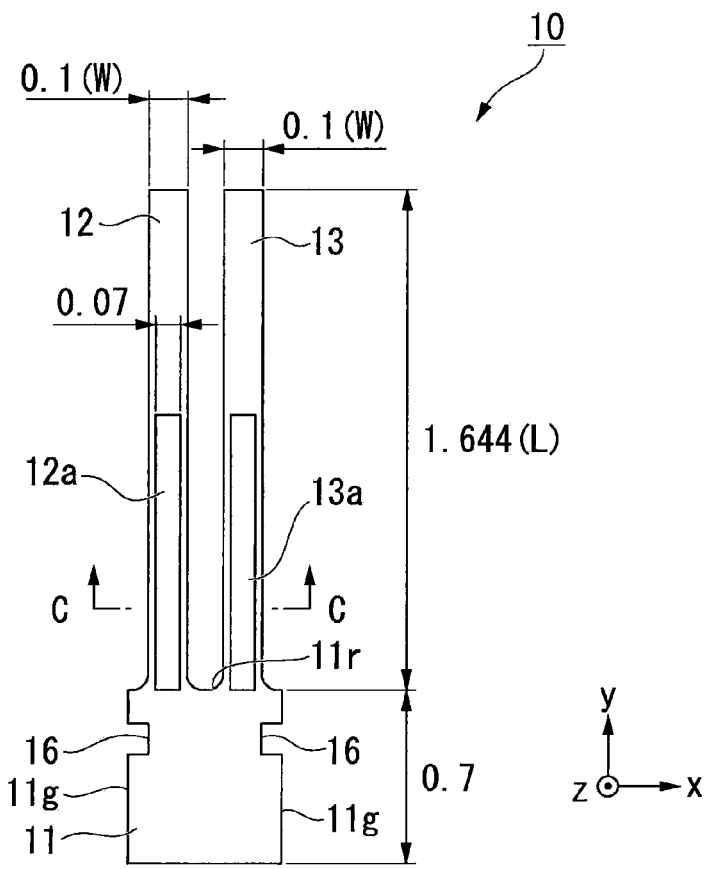
FIG. 15 is a plan view showing a conventional tuning-fork type quartz crystal vibratory structure.
Figure 16:
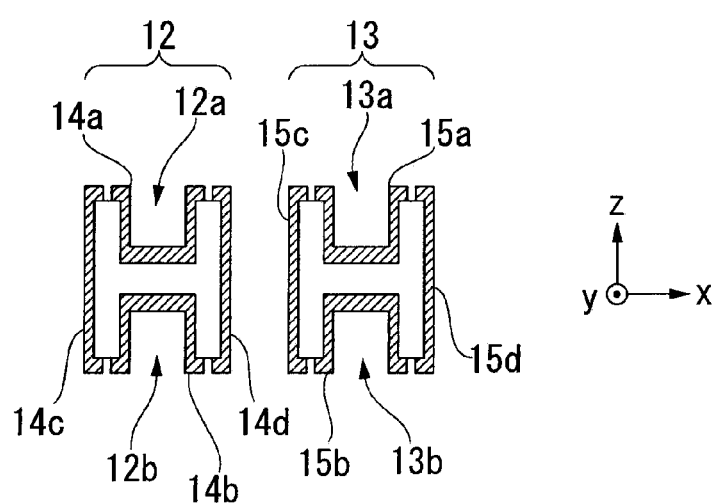
FIG. 16 is a schematic cross-sectional view taken along the line C-C shown in FIG. 15.
Figure 17A:
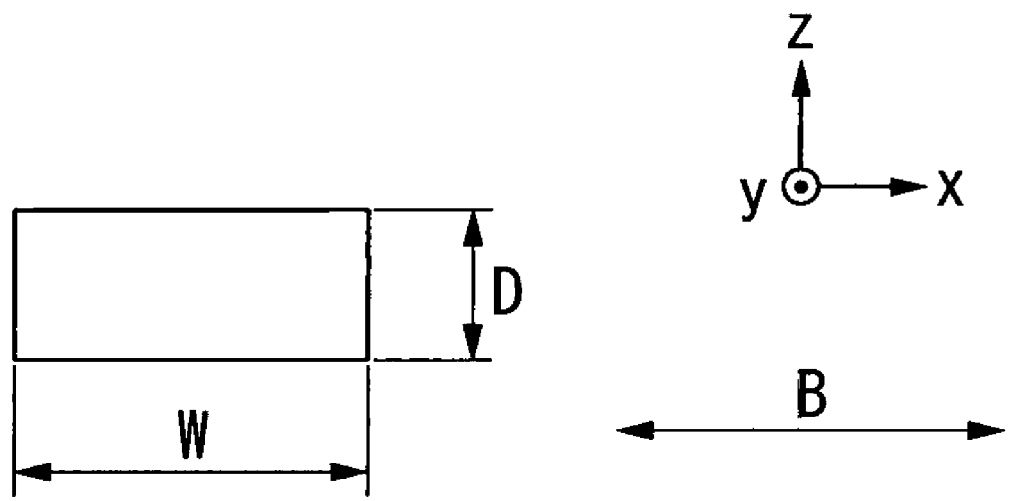
FIGS. 17A and 17B are conceptional diagrams illustrating vibration of a tuning-fork arm and showing a cross-sectional face of the tuning-fork arm.
Figure 17B:
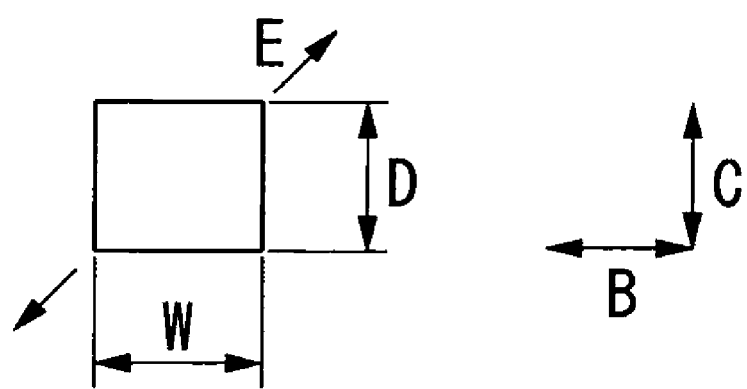

FIG. 14 is a schematic cross-sectional view showing a cylinder type tuning-fork vibrator 500 that is a vibrator of the sixth embodiment of the invention.

The cylinder type tuning-fork vibrator 500 uses the above-described tuning-fork type quartz crystal vibratory structure 100 of the first embodiment.

Therefore, identical symbols are used for the structures which are identical to the tuning-fork type quartz crystal vibratory structure 100, and the explanations thereof are omitted.

As shown in FIG. 14, the cylinder type tuning-fork vibrator 500 includes a cap 530 made of a metal. The cap 530 contains the tuning-fork type quartz crystal vibratory structure 100 therein.

A stem 520 is pressed into the cap 530, and the inside of the cap 530 is maintained in a vacuum state.

In addition, two leads 510 holding the tuning-fork type quartz crystal vibratory structure 100 contained in the cap 530 is disposed. The tuning-fork type quartz crystal vibratory structure 100 is shaped in a substantially "H" form.

When current of electricity is supplied to the foregoing cylinder type tuning-fork vibrator 500 from an external of the vibrator 500, tuning-fork arms 121 and 122 of the tuning-fork type quartz crystal vibratory structure 100 vibrate, and the cylinder type tuning-fork vibrator 500 functions as a vibrator.

Since the tuning-fork type quartz crystal vibratory structure 100 includes any of the structures of the first, second, and third embodiments as described above, the vibratory structure is downsized, and variations in the CI values of mass-produced vibratory structures are stabilized.

Consequently, the cylinder type tuning-fork vibrator 500 in which this vibratory structure is provided is also downsized, and it is possible to realize a vibrator with high performance, in which variations in the CI values of mass-produced vibratory structures are stabilized.

In addition, in each of the above-described embodiments, a tuning-fork type quartz crystal vibrator driven by 32.738 KHz is described as an example. However, a tuning-fork type quartz crystal vibrator driven by frequency range from 15 KHz to 155 KHz can be applied.

The tuning-fork type quartz crystal vibratory structure 100 of the above-described embodiments is not limited to the above-described examples, and is applied to an electronic device such as a personal digital assistance, a television, a video device, a radio-cassette recorder, a personal computer, a device built-in a clock, a watch, or the like.

What is claimed is:

1. A vibratory structure comprising:
   a first X-cut crystal substrate;
   a second X-cut crystal substrate stacked on the first X-cut crystal substrate so that the x-axis of the second X-cut crystal substrate is parallel to the x-axis of the first X-cut crystal substrate;
   a base formed by the first X-cut crystal substrate and the second X-cut crystal substrate;
   vibratory arm sections formed so as to be integrated together with the base in one body, and protruding from the base;
   an intermediate electrode sandwiched between the first X-cut crystal substrate and the second X-cut crystal substrate;
   a first drive electrode formed on an upper face of the vibratory arm section, the upper face being perpendicular to the x-axis of the vibratory arm section; and
   a second drive electrode formed on a back face of the vibratory arm section, the back face being perpendicular to the x-axis of the vibratory arm section, wherein a first voltage is supplied to both the first drive electrode and the second drive electrode, and a second voltage which has a phase opposite to the first voltage is supplied to the intermediate electrode.

2. The vibratory structure according to claim 1, wherein the base and the vibratory arm sections are formed so that the second X-cut crystal substrate is stacked on the first X-cut crystal substrate, the y-axis of the first X-cut crystal substrate is parallel to the y-axis of the second X-cut crystal substrate, and the z-axis of the first X-cut crystal substrate is parallel to the z-axis of the second X-cut crystal substrate.

3. The vibratory structure according to claim 1, wherein the base and the vibratory arm sections are formed so that the second X-cut crystal substrate is stacked on the first X-cut crystal substrate, the x-axis direction of the first X-cut crystal substrate is identical to the x-axis direction of the second X-cut crystal substrate.

4. The vibratory structure according to claim 1, wherein the base and the vibratory arm sections are formed so that the second X-cut crystal substrate is stacked on the first X-cut crystal substrate, the x-axis direction of the first X-cut crystal substrate is inverted to the x-axis direction of the second X-cut crystal substrate.

5. The vibratory structure according to claim 1, wherein the vibratory arm sections are disposed so that an upper face of the vibratory arm sections are parallel to an upper face of the base.

6. The vibratory structure according to claim 1, wherein the intermediate electrode is formed on each of the first X-cut crystal substrate and the second X-cut crystal substrate.

7. The vibratory structure according to claim 1, further comprising:
an insulating film that is adjacent to the intermediate electrode.

8. The vibratory structure according to claim 1, further comprising:
a plurality of the vibratory arm sections including a first vibratory arm section and a second vibratory arm section, the first vibratory arm section to which the first voltage is supplied and the second vibratory arm section to which the second voltage is supplied being adjacent to each other.

9. A vibrator comprising:
the vibratory structure according to claim 1; and
a package containing the vibratory structure.

10. An oscillator comprising:
the vibratory structure according to claim 1;
an integrated circuit; and
a package containing the vibratory structure and the integrated circuit.

11. The vibratory structure according to claim 1, further comprising:
a first vibratory arm section including a first drive electrode, a second drive electrode, and an intermediate electrode; and
a second vibratory arm section including an intermediate electrode, the intermediate electrode of the second vibratory arm section being electrically connected to the first drive electrode and the second drive electrode of the first vibratory arm section.

* * * * *